(12) United States Patent
Wang

(10) Patent No.: US 11,942,918 B2
(45) Date of Patent: Mar. 26, 2024

(54) SURFACE ACOUSTIC WAVE DEVICE AND FABRICATION METHOD THEREOF

(71) Applicant: Shenzhen Newsonic Technologies Co., Ltd., Shenzhen (CN)

(72) Inventor: Jian Wang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/325,204

(22) Filed: May 30, 2023

(65) Prior Publication Data

US 2023/0299736 A1    Sep. 21, 2023

(30) Foreign Application Priority Data

Apr. 19, 2023  (CN) .......................... 202310466673.5

(51) Int. Cl.
H03H 9/02  (2006.01)
H03H 3/08  (2006.01)
H03H 9/05  (2006.01)
H03H 9/145 (2006.01)

(52) U.S. Cl.
CPC .......... *H03H 3/08* (2013.01); *H03H 9/02661* (2013.01); *H03H 9/02834* (2013.01); *H03H 9/059* (2013.01); *H03H 9/14538* (2013.01)

(58) Field of Classification Search
CPC ...................... H03H 9/02834; H03H 9/14538
See application file for complete search history.

(56) References Cited

U.S. PATENT DOCUMENTS

| 2017/0370791 | A1* | 12/2017 | Nakamura | ............... G01L 1/165 |
| 2018/0269852 | A1* | 9/2018  | Daimon   | ............ H03H 9/02834 |
| 2019/0097607 | A1* | 3/2019  | Mimura   | ............ H03H 9/14541 |

* cited by examiner

*Primary Examiner* — Samuel S Outten
(74) *Attorney, Agent, or Firm* — Finnegan, Henderson, Farabow, Garrett & Dunner, LLP

(57) ABSTRACT

A surface acoustic wave (SAW) device includes a substrate; an interdigital transducer (IDT) having lead-out portions and arrays of interdigital electrodes formed on the substrate, wherein the interdigital electrodes includes central portions, end portions, and intermediate portions between the end portions and the lead-out portions, and a thickness of the interdigital electrodes at the end portions is greater than a thickness of the interdigital electrodes at the central portions and the intermediate portions, thereby forming protruding structures at the end portions of the interdigital electrodes; a protective layer formed on the protruding structures at the end portions of the interdigital electrodes; a first temperature compensation layer formed on the protective layer; a second temperature compensation layer formed on the first temperature compensation layer and on the central portions and the intermediate portions of the interdigital electrodes; and a passivation layer formed on the second temperature compensation layer.

15 Claims, 18 Drawing Sheets

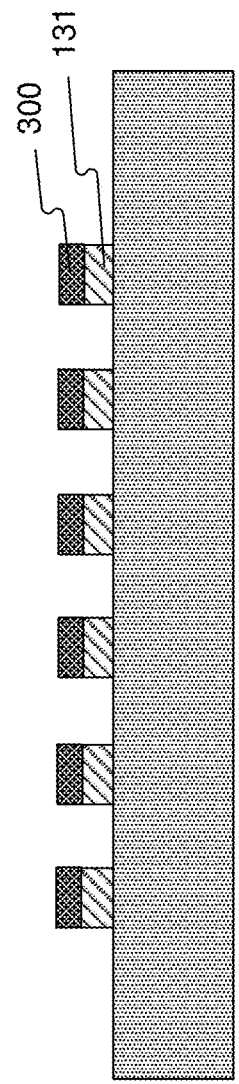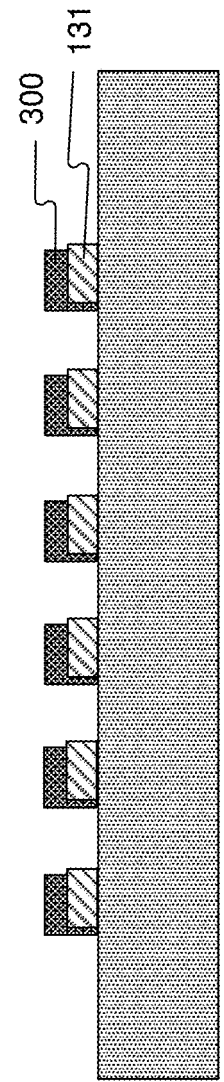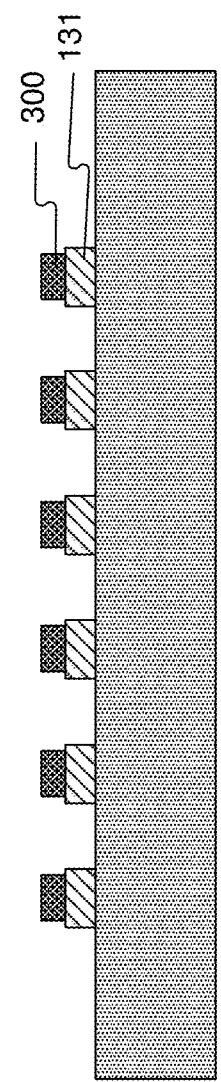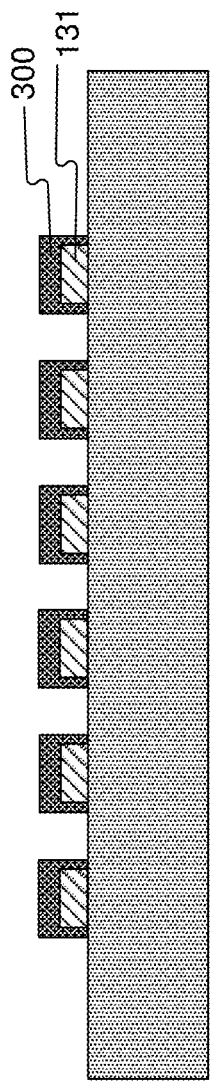

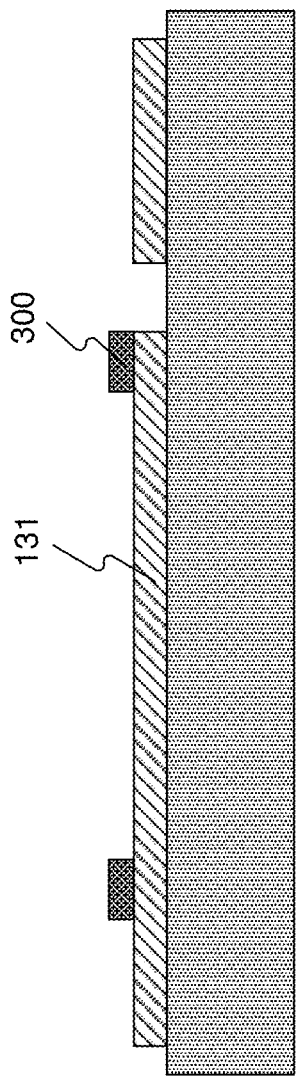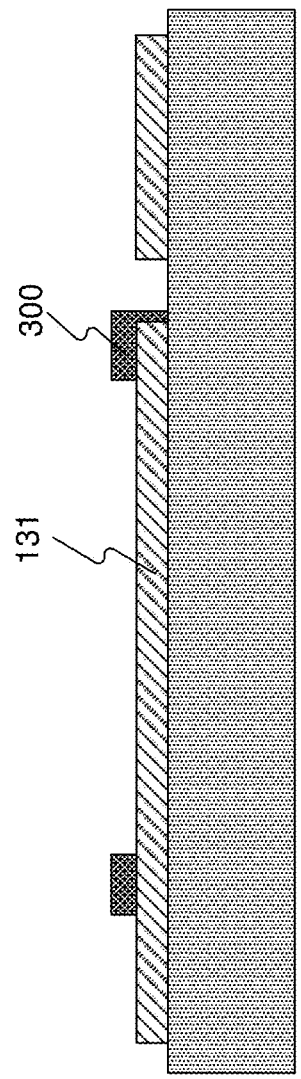

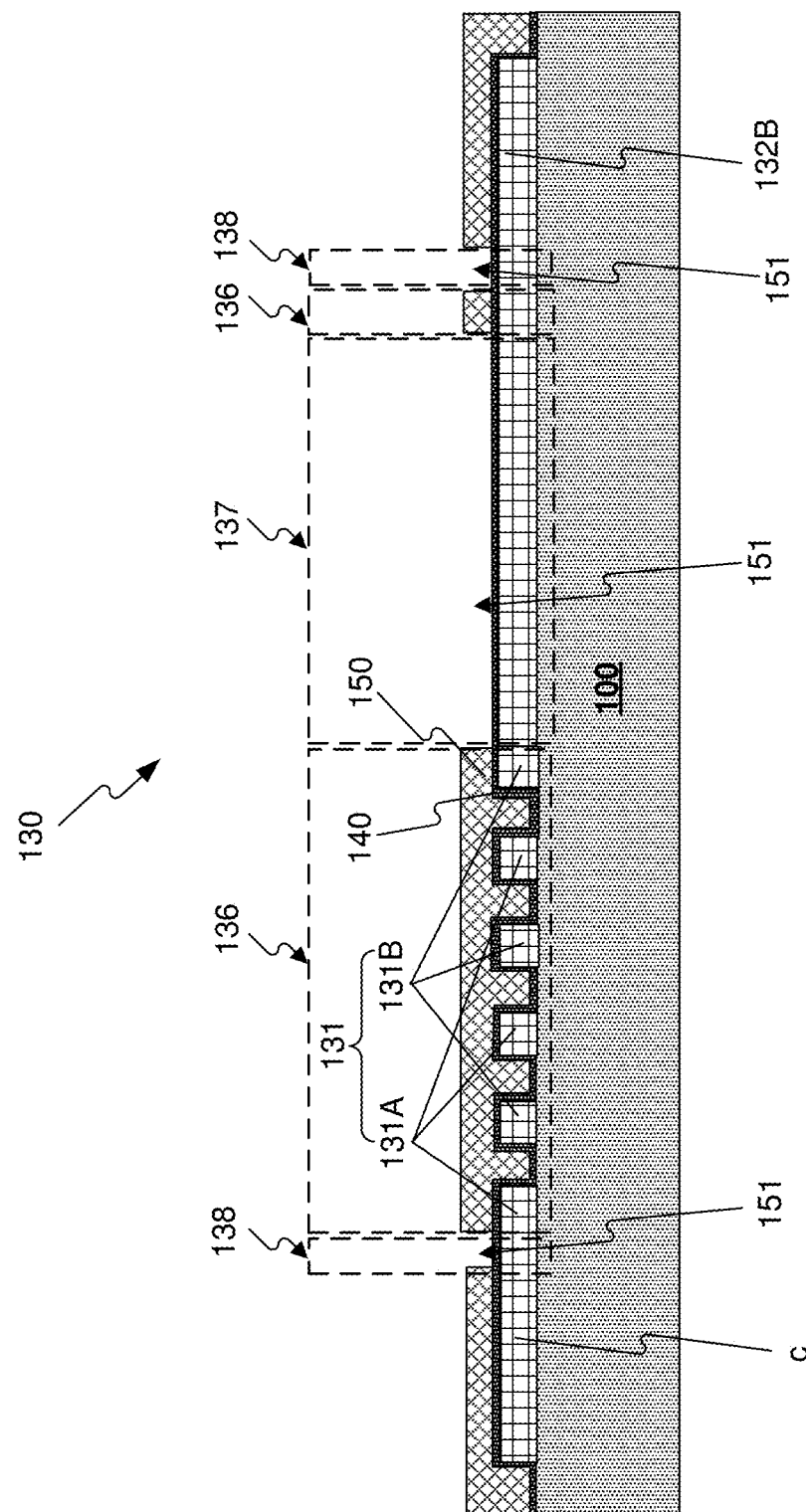

SURFACE ACOUSTIC WAVE DEVICE AND FABRICATION METHOD THEREOF

CROSS-REFERENCE TO RELATED APPLICATIONS

The present application is based on and claims priority to Chinese Patent Application No. 202310466673.5, filed on Apr. 19, 2023, the entire contents of which are hereby incorporated by reference.

FIELD OF THE DISCLOSURE

The present disclosure relates to the field of electronic devices and, in particular, to a surface acoustic wave device and fabrication method thereof.

BACKGROUND

Surface acoustic wave (SAW) devices, such as SAW resonators and SAW filters, are used in many applications such as radio frequency (RF) filters. A typical SAW filter includes a plurality of interdigital transducers (IDTs) formed on a piezoelectric substrate, and each IDT may include a plurality of interdigital electrodes. In some applications, a thin layer of silicon oxide ($SiO_2$) may be formed on the IDTs to obtain good temperature coefficient of frequency. Such a SAW device may be referred to as a temperature compensated-surface acoustic wave (TC-SAW) device.

SUMMARY

According to one aspect of the disclosure, a surface acoustic wave (SAW) device is provided. The SAW device includes a substrate; an interdigital transducer (IDT) having lead-out portions and arrays of interdigital electrodes formed on the substrate, wherein the interdigital electrodes include a central portion, end portions, and intermediate portions between the end portions and the lead-out portions, a thickness of the interdigital electrodes at the end portions is greater than a thickness of the interdigital electrodes at the central portions and the intermediate portions, thereby forming protruding structures at the end portions of the interdigital electrodes; a protective layer formed on the protruding structures; a first temperature compensation layer formed on the protective layer; and a second temperature compensation layer formed on the first temperature compensation layer and on the central portion and the intermediate portions of the interdigital electrodes; and a passivation layer formed on the second temperature compensation layer.

According to another aspect of the disclosure, a method for fabricating a surface acoustic wave (SAW) device is provided. The method includes forming an interdigital transducer (IDT) having lead-out portions and arrays of interdigital electrodes on a substrate, wherein the interdigital electrodes include central portions, end portions, lead-out portions, and intermediate portions between the end portions and the lead-out portions; forming a protective layer on the IDT; forming a first temperature compensation layer on the protective layer; forming openings in the first temperature compensation layer to expose portions of the protective layer on the central portion and the intermediate portions of the interdigital electrodes; etching the exposed portions of the protective layer, and etching the central portions and the intermediate portions of the interdigital electrodes to a preset thickness, to form protruding structures at the end portions of the interdigital electrodes; forming a second temperature compensation layer on the first temperature compensation layer and on the central portions and the intermediate portions of the interdigital electrodes; and forming a passivation layer on the second temperature compensation layer.

BRIEF DESCRIPTION OF DRAWINGS

The accompanying drawings, which are incorporated in and constitute a part of this application, illustrate disclosed embodiments and, together with the description, serve to explain the disclosed embodiments.

FIGS. 2A-2D are sectional views of the TC-SAW device of FIG. 1, along line a-a' of FIG. 1, in different alignment situations.

FIGS. 3A and 3B are sectional views of the TC-SAW device of FIG. 1, along line b-b' of FIG. 1, in different alignment situations.

FIGS. 6A-6K are cross-sectional views of structures formed in the process of fabricating the TC-SAW device of FIGS. 4A-4C, along line A-A' of FIG. 4A, according to an embodiment of the present disclosure.

DETAILED DESCRIPTION

Figure 1:
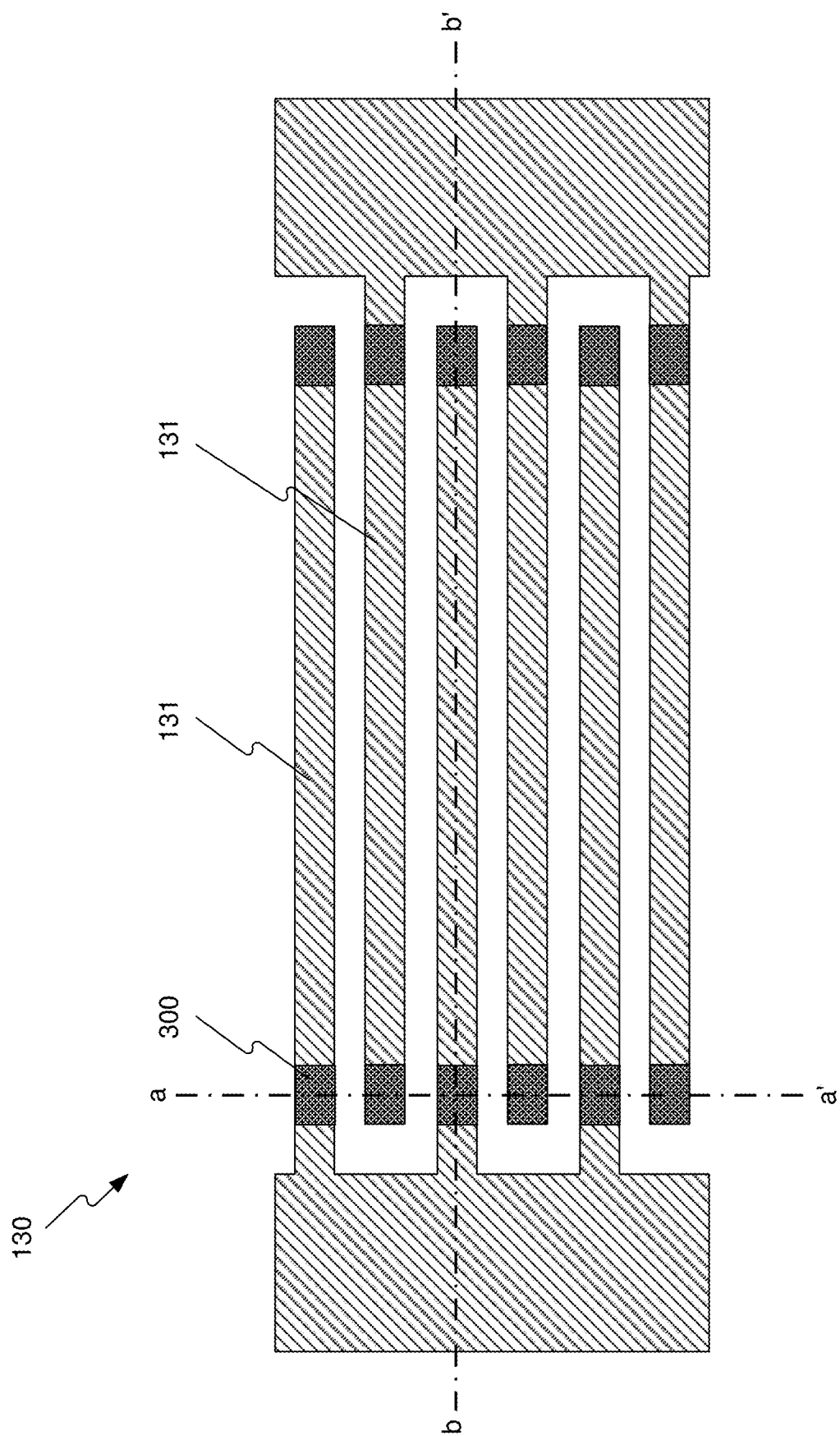
FIG. 1 is a top view of a temperature compensated-surface acoustic wave (TC-SAW) device.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

FIG. 1 is a top view of a temperature compensated-surface acoustic wave (TC-SAW) device. As illustrated in FIG. 1, the TC-SAW device may include an interdigital transducer (IDT) 130 having a plurality of interdigital electrodes 131 and small pieces of metal blocks 300 (also referred to as "Hammer Head") are superimposed on both ends of each interdigital electrode 131 to form protruding structures to suppress clutter and ensure excellent filter performance. Clutter suppression works best when the edges of metal blocks 300 and the edges of interdigital electrodes 131 are perfectly aligned. Conventionally, protruding metal blocks 300 are formed on the ends of interdigital electrodes 131 through a lift-off process. During the lift-off process, a photolithography process (coating photoresist, exposure, and development) is performed on a substrate formed with interdigital electrodes 131 to obtain openings in the photoresist that expose the ends of interdigital electrodes 131. Then, a metal layer is plated on substrate by metal evaporation, and the photoresist and the metal attached to the photoresist are stripped, leaving only the metal plated on the ends of interdigital electrodes 131, thereby obtaining protruding metal blocks 300 at the ends of interdigital electrodes 131. Therefore, protruding metal blocks 300 and interdigital electrodes 131 are not formed from the same integral material, but from two independent material layers. The photolithography process might cause a deviation in the alignment of metal blocks 300 with interdigital electrodes 131, or a deviation in the line widths of metal blocks 300. As a result, protruding metal blocks 300 may not be completely vertically aligned with the edges of interdigital electrodes 131.

FIGS. 2A-2D are sectional views of the TC-SAW device of FIG. 1, along line a-a' of FIG. 1, in different alignment situations. As illustrated in FIG. 2A, in an ideal situation, protruding metal blocks 300 and interdigital electrodes 131 are completely vertically aligned. As illustrated in FIG. 2B, protruding metal block 300 and interdigital electrodes 131 are not aligned in the vertical direction, and protruding metal blocks 300 are off to one side of the corresponding interdigital electrodes 131. As illustrated in FIG. 2C, the width of protruding metal blocks 300 is narrower than the width of interdigital electrodes 131. As illustrated in FIG. 2D, the width of protruding metal blocks 300 are wider than the width of interdigital electrodes 131.

FIGS. 3A and 3B are sectional views of the TC-SAW device of FIG. 1, along line b-b' of FIG. 1, in different alignment situations. As illustrated in FIG. 3A, in an ideal situation, protruding metal blocks 300 and interdigital electrodes 131 are completely vertically aligned. As illustrated in FIG. 3B, protruding metal blocks 300 and interdigital electrodes 131 are not aligned in the vertical direction, and protruding metal blocks 300 are off to one side of the corresponding interdigital electrodes 131.

The misalignment between the metal blocks and the interdigital electrodes may bring about differences in the effect of clutter suppression, which affects performance and individual consistency of the filter of the TC-SAW device.

Embodiments of the present disclosure provide a fabrication method for a TC-SAW. The fabrication process uses a precise etching back method to partially etch central portions of the interdigital electrodes, so that end portions of the interdigital electrodes are thicker than the central portions, thereby forming protruding structures at the end portions of the interdigital electrodes. As a result, the protruding structures and the interdigital electrodes are formed from an integral material layer without mutual interfaces, and the protruding structures and the interdigital electrodes may be completely vertically aligned. In order to ensure accuracy and efficiency of the etching back process, a protective layer (also referred to as a "SiO2 etch stop layer") is deposited on the surface of the interdigital electrodes, so that a temperature compensation layer (SiO2) on the central portions of interdigital electrodes are first etched to expose the protective layer on the central portions of interdigital electrodes of the interdigital electrodes, and then precise ion beam etching (IBE) or a similar process is performed to accurately etch away the protective layer on the central portions of the interdigital electrodes and a part of the central portions of the interdigital electrodes using self-alignment. In this way, the interdigital electrodes with uniform thickness that meet a target thickness requirement are preserved.

Figure 4A:
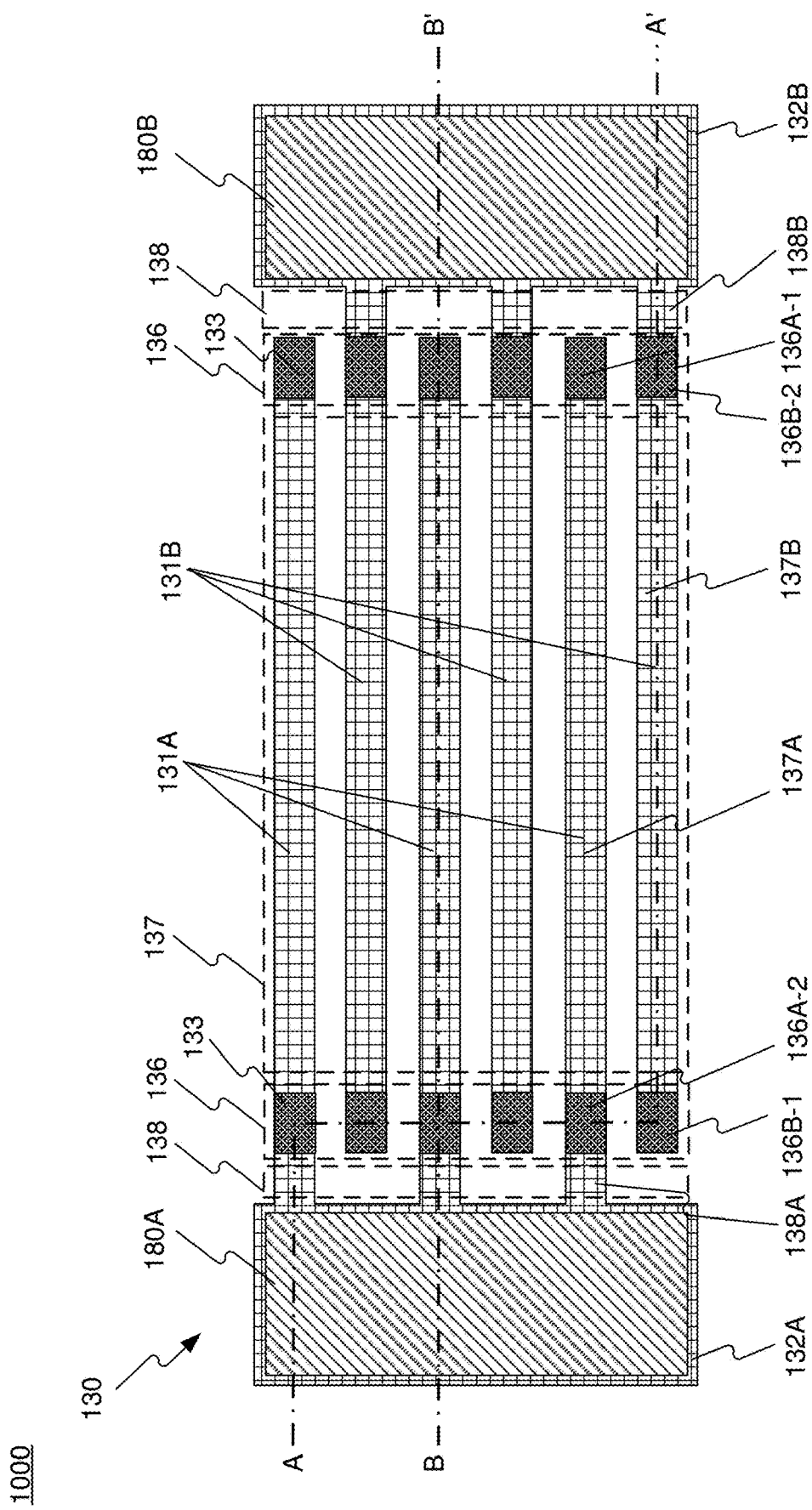
FIG. 4A is a top view of a TC-SAW device, according to an embodiment of the present disclosure.
Figure 4B:
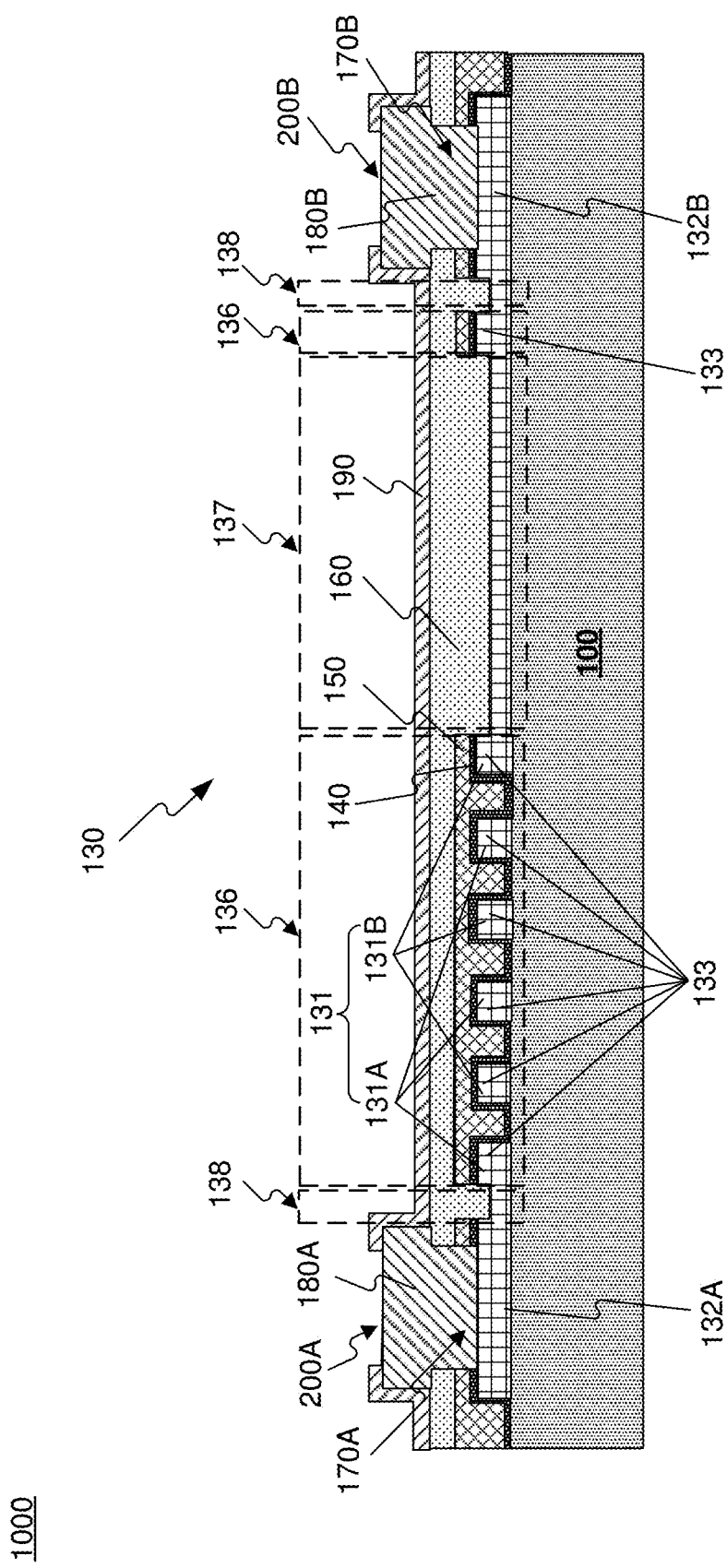
FIG. 4B is a sectional view of the TC-SAW device of FIG. 4A, along line A-A' of FIG. 4A, according to an embodiment of the present disclosure.
Figure 4C:
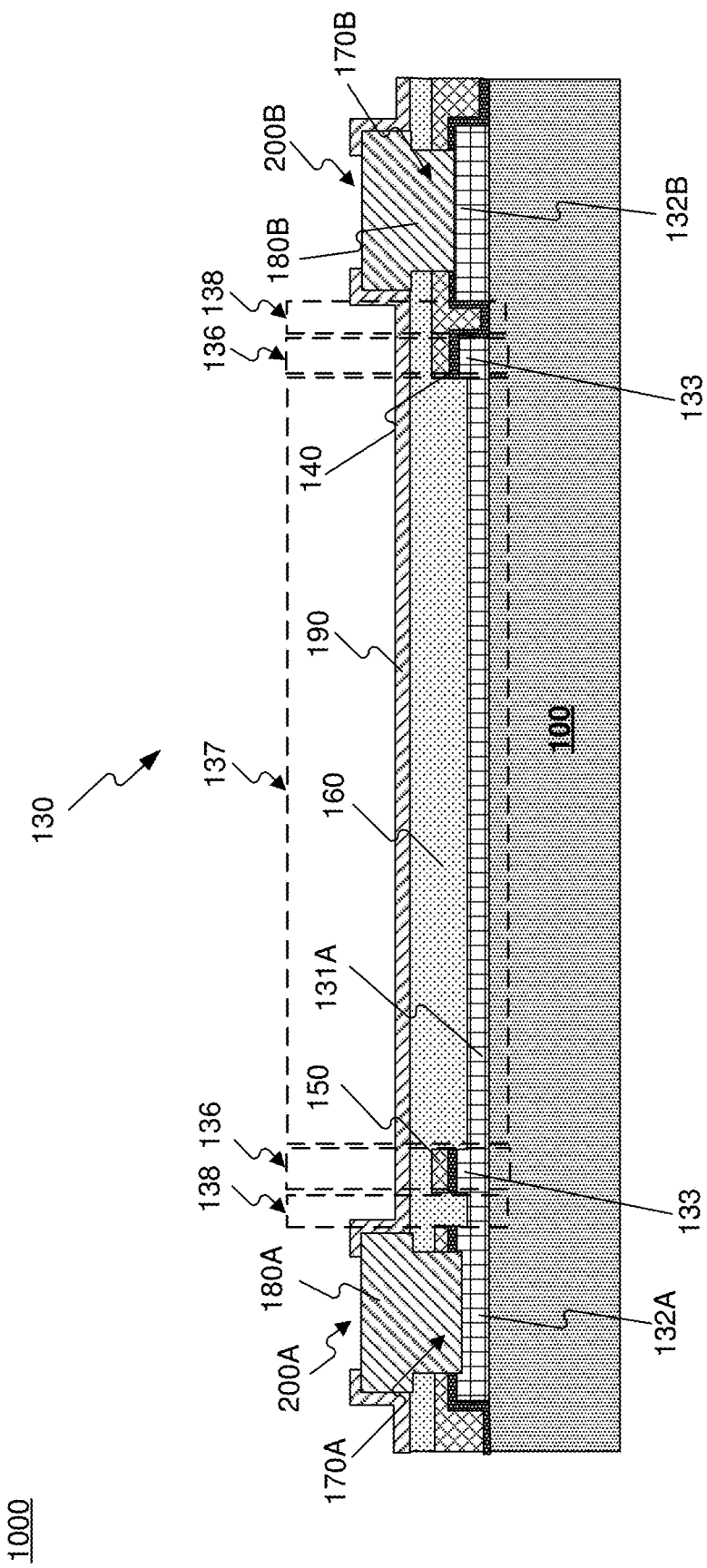
FIG. 4C is a sectional view of TC-SAW device of FIG. 4A, along line B-B' of FIG. 4A, according to an embodiment of the present disclosure.

FIG. 4A is a top view of a TC-SAW device 1000, according to an embodiment of the present disclosure. FIG. 4B is a sectional view of TC-SAW device 1000, along line A-A' of FIG. 4A. FIG. 4C is a sectional view of TC-SAW device 1000, along line B-B' of FIG. 4A.

As illustrated in FIGS. 4A-4C, TC-SAW device 1000 may include a substrate 100, an interdigital transducer (IDT) 130, a protective layer 140, a first temperature compensation layer 150, a second temperature compensation layer 160, and a passivation layer 190. TC-SAW device 1000 may further include a first IDT via 170A, a second IDT via 170B, a first pad metal layer 180A, a second pad metal layer 180B, a first pad contact window 200A, and a second pad contact window 200B.

Substrate 100 may be formed of a piezoelectric material, for example, lithium niobate or lithium tantalate.

IDT 130 includes lead-out portions and arrays of interdigital electrodes, such as an array of first interdigital electrodes 131A, an array of second interdigital electrodes 131B, a first lead-out portion 132A connected to the array of first interdigital electrodes 131A, and a second lead-out portion 132B connected to the array of second interdigital electrodes 131B. First interdigital electrodes 131A are interleaved with, and parallel to, second interdigital electrodes 131B. In the descriptions below, first interdigital electrodes 131A and second interdigital electrodes 131B are also collectively referred to as "interdigital electrodes 131," and first lead-out portion 132A and second lead-out portion 132B are also collectively referred to as "lead-out portions 132."

Interdigital electrodes 131 include end portions 136 disposed at opposite end regions of interdigital electrodes 131, central portions 137 disposed between end portions 136, and intermediate portions 138 each disposed between one of end portions 136 and a corresponding one of lead-out portions 132. For example, as illustrated in FIG. 4A, each first interdigital electrode 131A includes, from right (a tip of first interdigital electrode 131A) to left (the portion connected to first lead-out portion 132A), a first end portion 136A-1, a central portion 137A, a second end portion 136A-2, and an intermediate portion 138A; and each second interdigital electrode 131B includes, from left (a tip of second interdigital electrode 131B) to right (the portion connected to second lead-out portion 132B), a first end portion 136B-1, a central portion 137B, a second end portion 136B-2, and an intermediate portion 138B. First end portions 136A-1 of first interdigital electrodes 131A are aligned with second end portions 136B-2 of second interdigital electrodes 131B to form a first row extending in a direction perpendicular to an extending direction of interdigital electrodes 131; first end portions 136B-1 of second interdigital electrodes 131B are aligned with second end portions 136A-2 of first interdigital electrodes 131A to form a second row extending in the direction perpendicular to the extending direction of interdigital electrodes 131.

A thickness of each interdigital electrode 131 at end portions 136 is greater than a thickness of interdigital electrodes 131 at central portion 137, thereby forming protruding structures 133 at end portions 136 of interdigital electrodes 131.

Protruding structures 133 and interdigital electrodes 131 may be formed from the same material without mutual interfaces, and protruding structures 133 and interdigital electrodes 131 are vertically aligned. Although protruding structures 133 and interdigital electrodes 131 illustrated in FIG. 4A have different patterns, protruding structures 133 and interdigital electrodes 131 are formed from the same material and are illustrate in FIGS. 4B and 4C to have the same patterns.

First lead-out portion 132A and second lead-out portion 132B are located outside of terminal parts of first interdigital electrodes 131A and second interdigital electrodes 131B, respectively. First lead-out portion 132A and second lead-out portion 132B serve as external electrical connection parts for the corresponding of first interdigital electrodes 131A and second interdigital electrodes 131B.

Protective layer 140 covers end portions 136 of interdigital electrodes 131, including top and side surfaces of protruding structures 133 formed at end portions 136 of interdigital electrodes 131. Protective layer 140 also covers portions of first lead-out portion 132A and second lead-out portion 132B. As will be described in more details later, the portions of the protective layer 140 covering central portions 137 and intermediate portions 138 of interdigital electrodes 131 are removed during the fabrication process of TC-SAW device 1000, and therefore central portions 137 and intermediate portions 138 of interdigital electrodes 131 are not covered with protective layer 140.

First temperature compensation layer 150 covers the surface of protective layer 140 that covers end portions 136 of interdigital electrodes 131 and covers portions of first lead-out portion 132A and second lead-out portion 132B. As will be described in more details later, the portions of first temperature compensation layer 150 covering central portions 137 and intermediate portions 138 of interdigital electrodes 131 are removed during the fabrication process of TC-SAW device 1000, and therefore central portions 137 and intermediate portions 138 of interdigital electrodes 131 are not covered with first temperature compensation layer 150.

Second temperature compensation layer 160 covering the surface of central portions 137 and intermediate portions 138 of interdigital electrodes 131, and the surface of first temperature compensation layer 150.

First IDT via 170A and second IDT via 170B are formed by etching selected portions of second temperature compensation layer 160, first temperature compensation layer 150, and protective layer 140, to expose surfaces of first and second interdigital lead-out portions 132A and 132B at the bottom.

First pad metal layer 180A and second pad metal layer 180B are respectively in first IDT via 170A and second IDT via 170B, respectively, and are electrically connected to first and second interdigital lead-out portions 132A and 132B through first IDT via 170A and second IDT via 170B, respectively.

Passivation layer 190 covers the surface of second temperature compensation layer 160 and first and second pad metal layers 180A and 180B. As illustrated in FIGS. 4B and 4C, protective layer 140, first temperature compensation layer 150, second temperature compensation layer 160 are formed between passivation layer 190 and end portions 136 of interdigital electrodes 131, while only second temperature compensation layer 160 is formed between passivation layer 190 and central portions 137 and intermediate portions 138 of interdigital electrodes 131.

First pad contact window 200A and second pad contact window 200B are formed by etching passivation layer 190 to expose first and second pad metal layers 180A and 180B at the bottom, respectively. First and second pad contact windows 200A and 200B serve as windows for external electrical connection.

Figure 5:
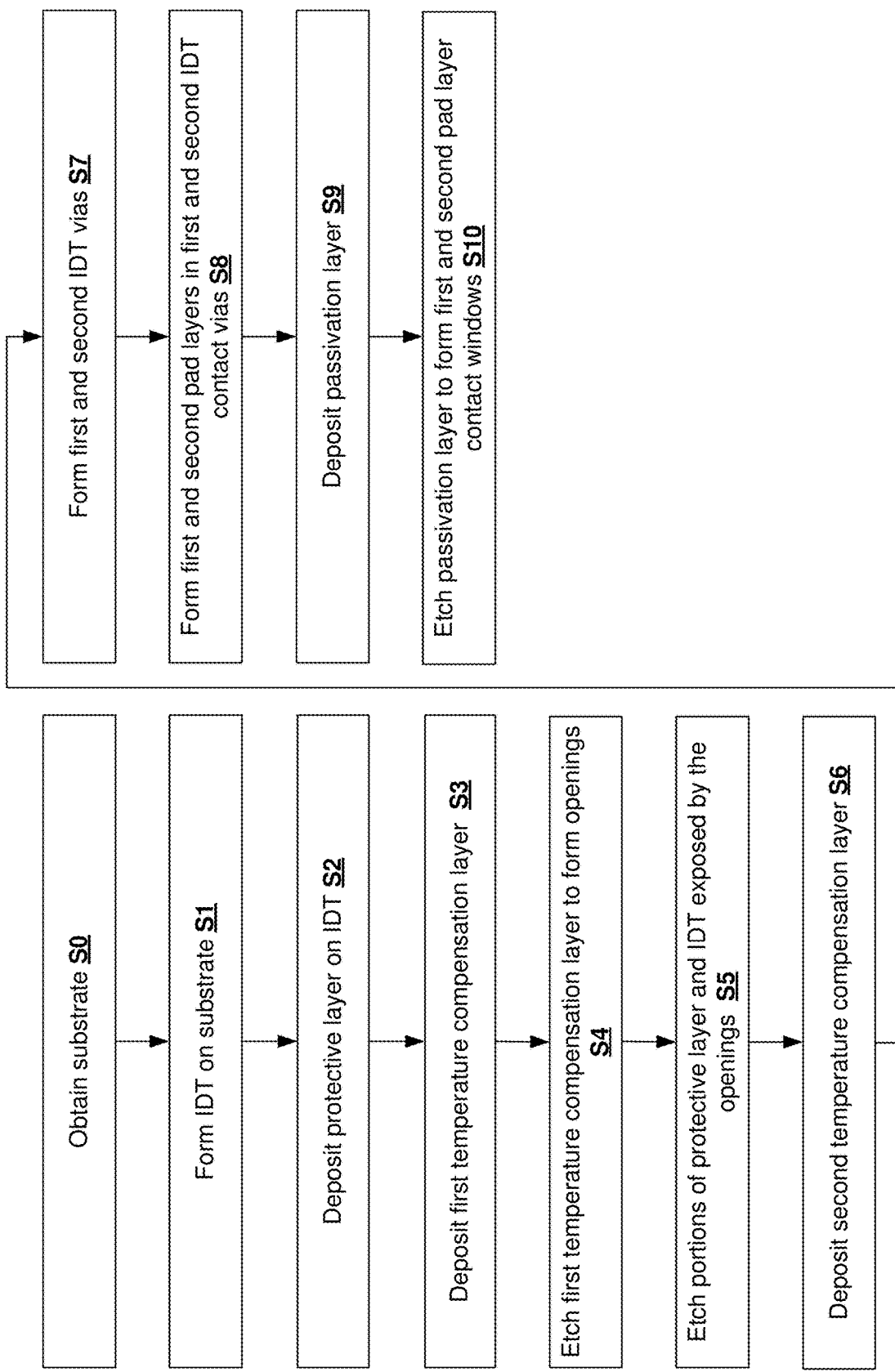
FIG. 5 is a flow chart of a process of fabricating the TC-SAW device of FIGS. 4A-4C, according to an embodiment of the present disclosure.

FIG. 5 is a flow chart of a process 1100 of fabricating TC-SAW device 1000 of FIGS. 4A-4C, according to an embodiment of the present disclosure. FIGS. 6A-6K are cross-sectional views of structures formed in process 1100, along line A-A' of FIG. 4A, according to an embodiment of the present disclosure.

Figure 6A:
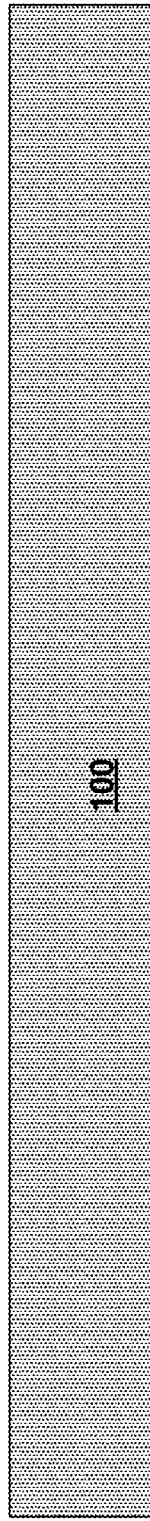

As illustrated in FIG. 6A, in step S0, substrate 100 is obtained. Substrate 100 may be formed of a piezoelectric material, for example, lithium niobate or lithium tantalate.

Figure 6B:
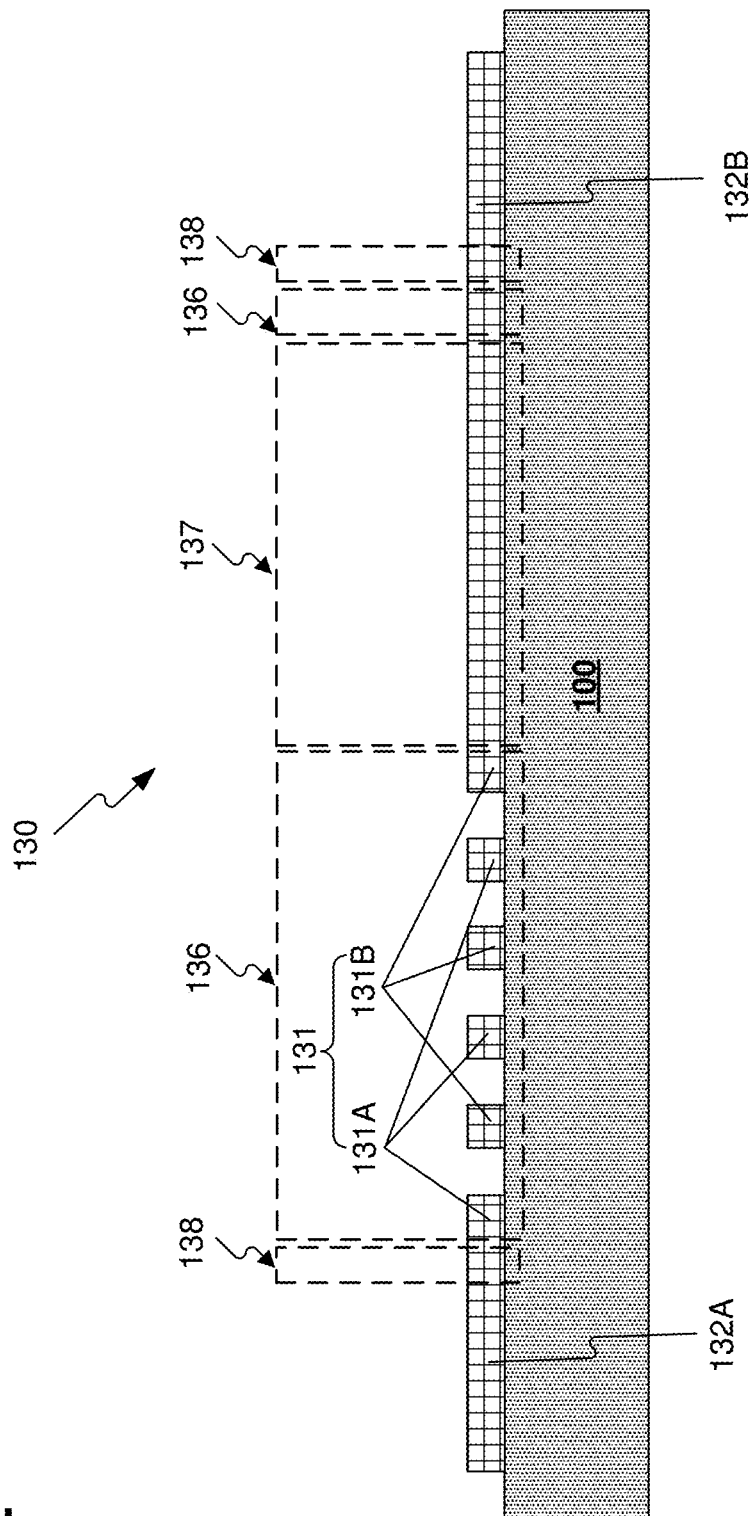

As illustrated in FIG. 6B, in step S1, IDT 130 is formed on substrate 100. IDT 130 may by formed by using a lift-off process. IDT 130 may be formed of a metal, for example, Ti, Cr, Ag, Cu, Mo, Pt, W, Al, or a stacked combination of two or more of those metal materials. As described above with reference to FIG. 4A, IDT 130 includes an array of first interdigital electrodes 131A, an array of second interdigital electrodes 131B, a first lead-out portion 132A connected to the array of first interdigital electrodes 131A, and a second lead-out portion 132B connected to the array of second interdigital electrodes 131B. Interdigital electrodes 131 include end portions 136 disposed at opposite end regions of interdigital electrodes 131, central portions 137 disposed between end portions 136, and intermediate portions 138 each disposed between one of end portions 136 and a corresponding one of lead-out portions 132.

Figure 6C:
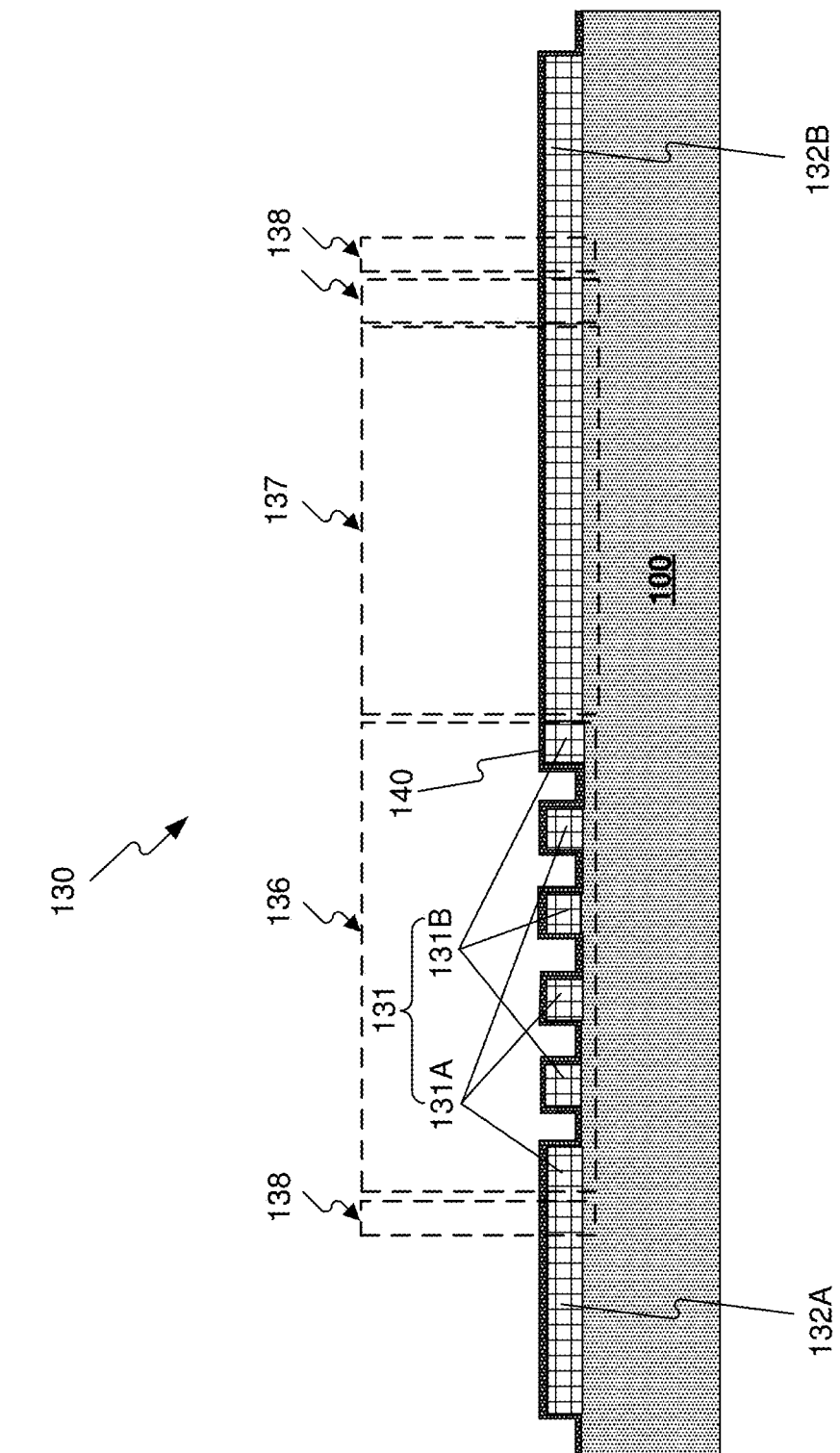

As illustrated in FIG. 6C, in step S2, protective layer 140 is deposited on the structure of FIG. 6B. Protective layer 140 covers all sides and surfaces of interdigital electrode 131. Protective layer 140 may be formed of silicon nitride (SiN), aluminum nitride (AlN), gallium nitride (GaN), or amorphous silicon (α-Si).

Figure 6D:
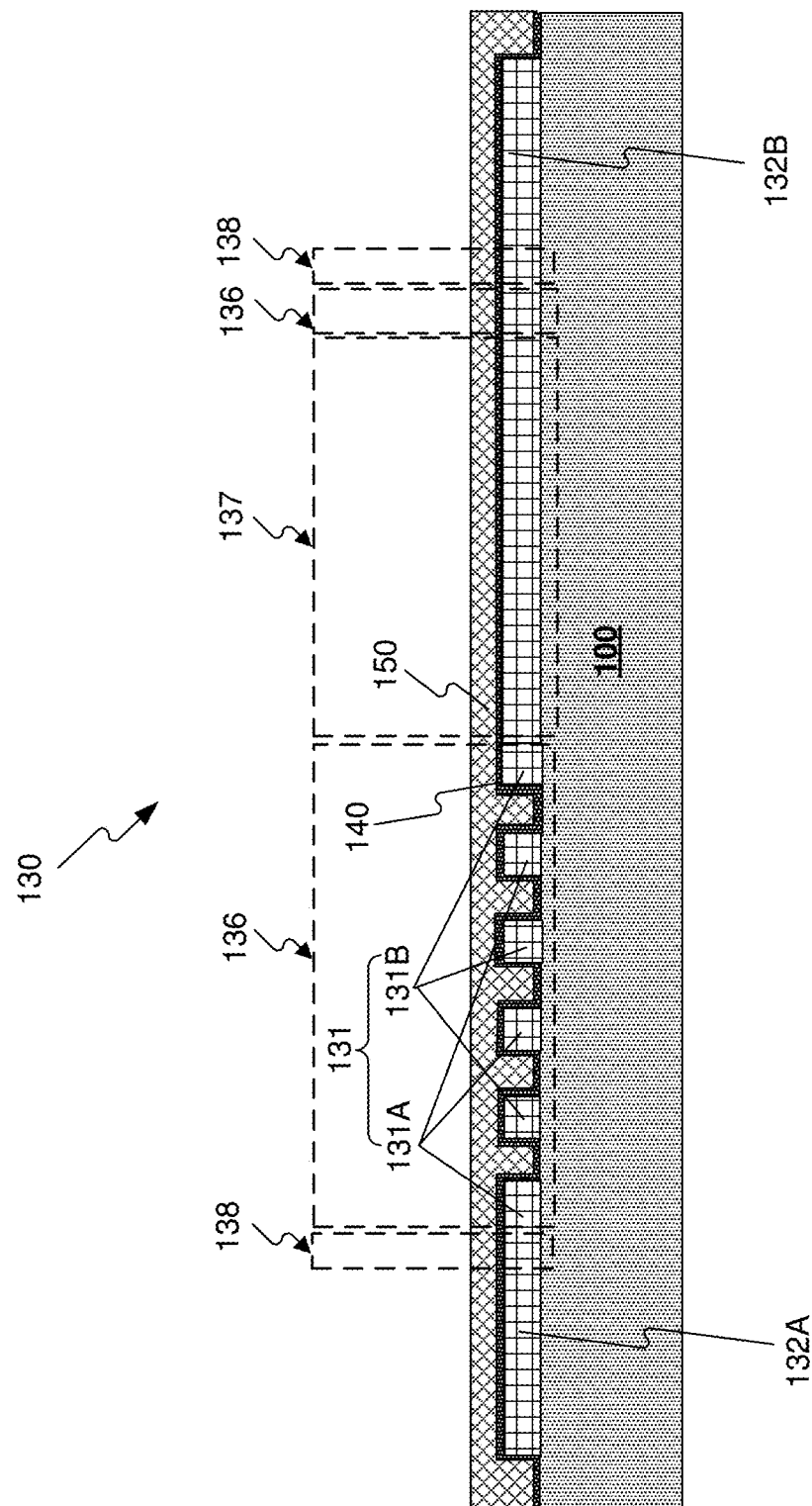

As illustrated in FIG. 6D, in step S3, first temperature compensation layer 150 is deposited on the structure of FIG. 6C, and a top surface of the deposited first temperature compensation layer 150 is planarized by, for example, chemical mechanical polishing (CMP) planarization. First temperature compensation layer 150 covers all of the surfaces of protective layer 140. First temperature compensation layer 150 may be formed of $SiO_2$.

As illustrated in FIG. 6E, in step S4, first temperature compensation layer 150 is patterned by a photolithography processing and etching to form openings 151 that expose portions of protective layer 140 that are disposed above central portions 137 and intermediate portions 138 of interdigital electrodes 131. After etching first temperature compensation layer 150, a photoresist layer used for the photolithography process is removed. Protective layer 140 functions as an etching stop layer when etching first temperature compensation layer 150. When protective layer 140 is formed of SiN, AlN, GaN, α-Si, or a similar material, and first temperature compensation layer 150 is formed from SiO$_2$, a high etching selectivity ratio may be achieved. Therefore, protective layer 140 may be made relatively thin while still functions properly as the etching stop layer for first temperature compensation layer 150.

Figure 6F:
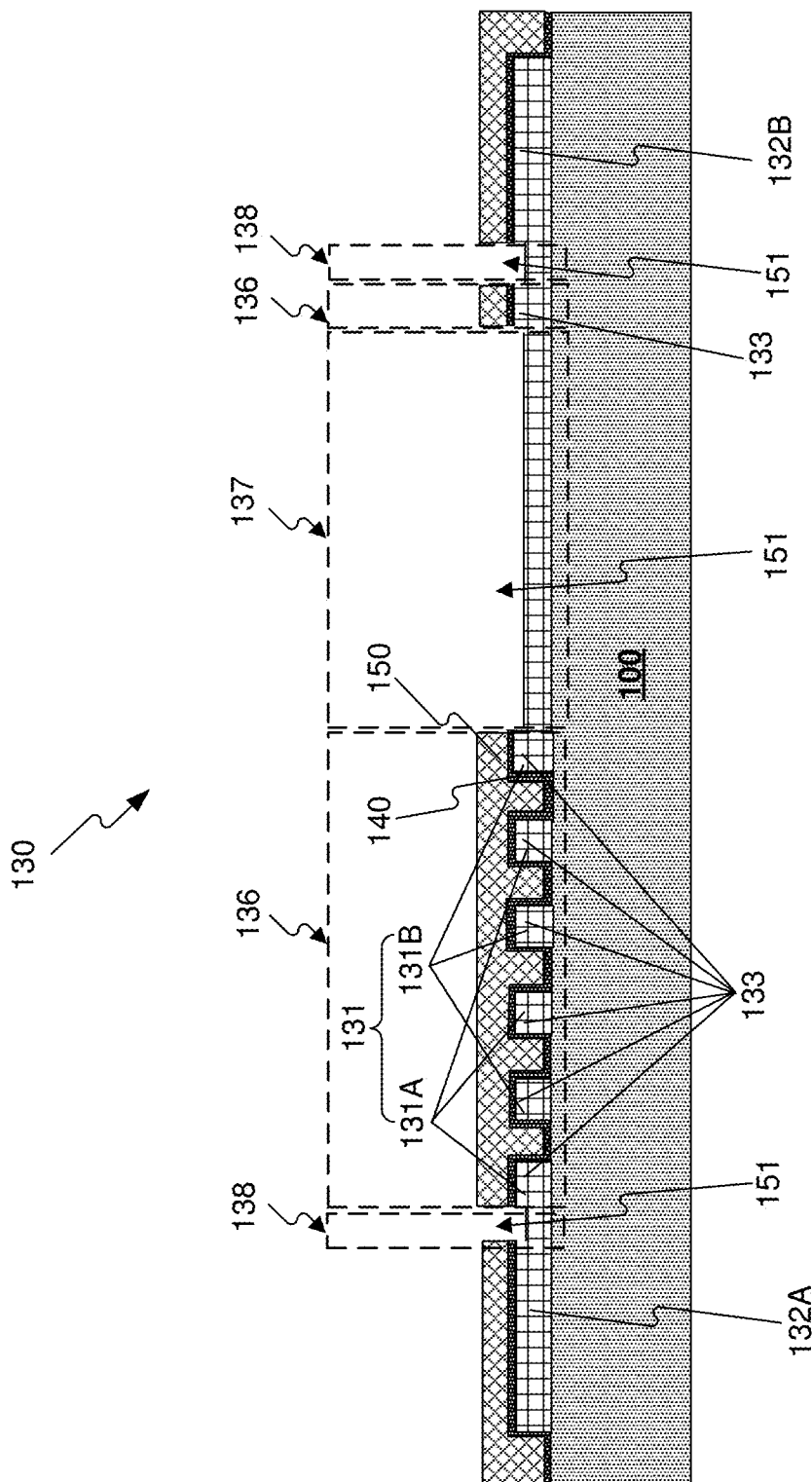

As illustrated in FIG. 6F, in step S5, using first temperature compensation layer 150 as a hard mask, the portions of protective layer 140 exposed by openings 151 of first temperature compensation layer 150, and top layers of central portions 137 and intermediate portions 138 of interdigital electrodes 131 disposed under the portions of protective layer 140 exposed by openings 151 of first temperature compensation layer 150, are removed by using a precise etching process, for example, ion beam etching (IBE). As a result, a thickness of central portions 137 of interdigital electrodes 131 is accurately controlled to be at a target thickness. There is still a sufficiently thick first temperature compensation layer 150 remaining on the surface of end portions 136 of interdigital electrodes 131 after etching, so as to prevent end portions 136 of interdigital electrodes 131 from being damaged by etching. In some embodiments, the thickness of multiple points at central portions 137 of interdigital electrodes 131 may be measured to generate a wafer map in terms of thickness. According to the wafer map in terms of thickness, a thickness trimming process such as the IBE process may be performed to realize fine etching, so as to obtain a uniform and consistent target thickness on central portions 137 of interdigital electrodes 131. After the etching process, central portion 137 of interdigital electrodes 131 is thinner than end portions 136 of interdigital electrodes 131. In other words, end portions 136 of interdigital electrodes 131 protrude upwards compared to central portions 137 of interdigital electrodes 131, thereby forming protruding structures 133 at end portions 136 of interdigital electrodes 131. Protruding structures 133 at end portions 136 of interdigital electrodes 131 are formed of the same material as the other portions (i.e., central portions 137 and intermediate portions 138) of interdigital electrodes 131. There is no interface between protruding structures 133 and interdigital electrodes 131. Protruding structures 133 are completely vertically aligned with interdigital electrodes 131.

Figure 6G:
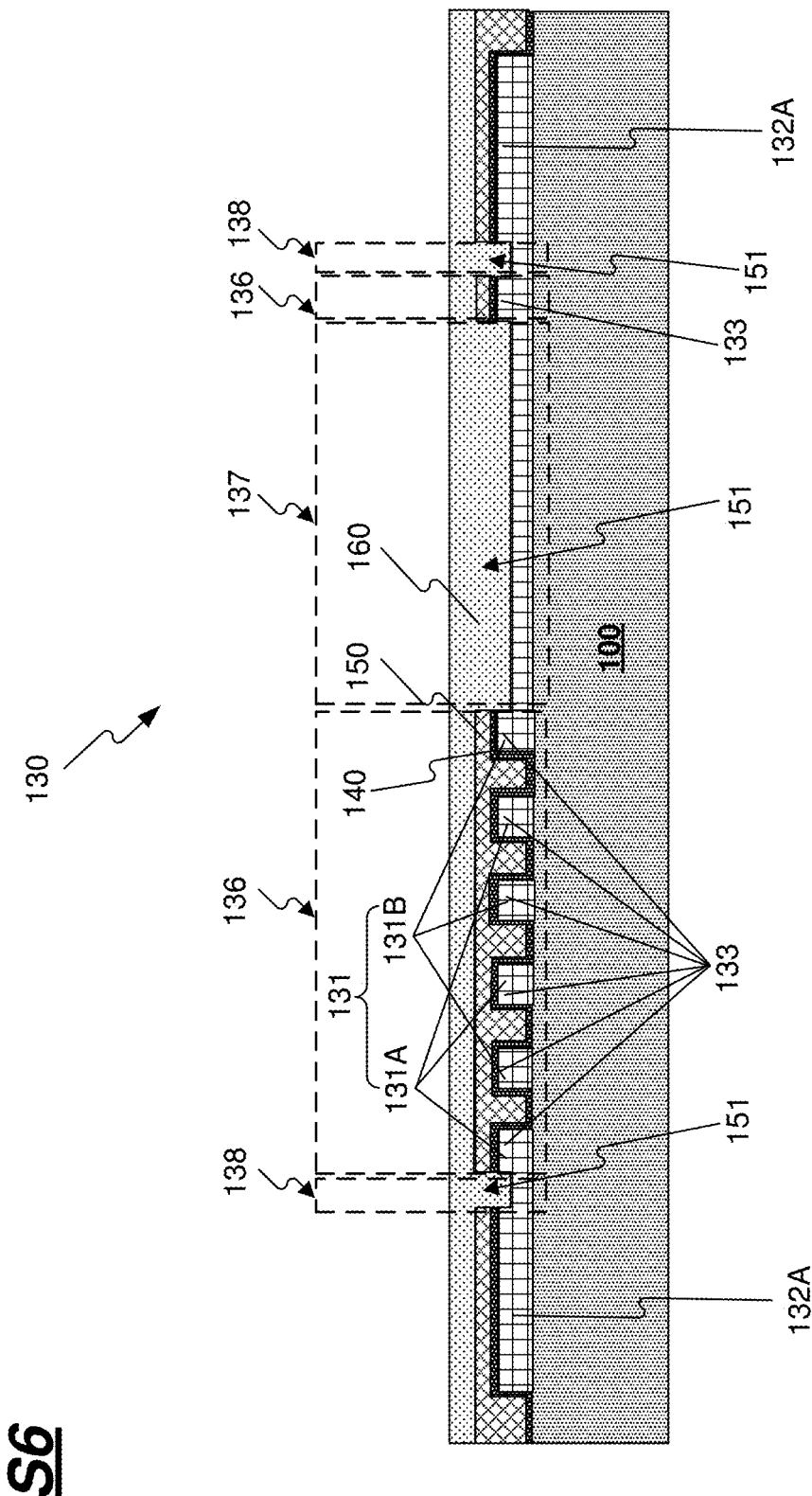

As illustrated in FIG. 6G, in step S6, second temperature compensation layer 160 is deposited on the structure of FIG. 6F, and a top surface of the deposited second temperature compensation layer 160 is planarized by, for example, CMP planarization. Second temperature compensation layer 160 covers the surface of first temperature compensation layer 150 and the surface of the portions of interdigital electrodes 131 exposed by openings 151 of first temperature compensation layer 150, i.e., central portions 137 and intermediate portions 138 of interdigital electrodes 131. Second temperature compensation layer 160 may be a single layer of SiO$_2$, or a stacked combination of a thin layer of SiN, AlN, amorphous silicon, or GaN, and a thick layer of SiO$_2$. The thin layer of SiN, AlN, amorphous silicon, or GaN may function as a protective layer to prevent the exposed portions of interdigital electrodes 131, i.e., central portions 137 and intermediate portions 138 of interdigital electrodes 131, from being oxidized when the thick layer of SiO$_2$ is deposited.

Figure 6H:
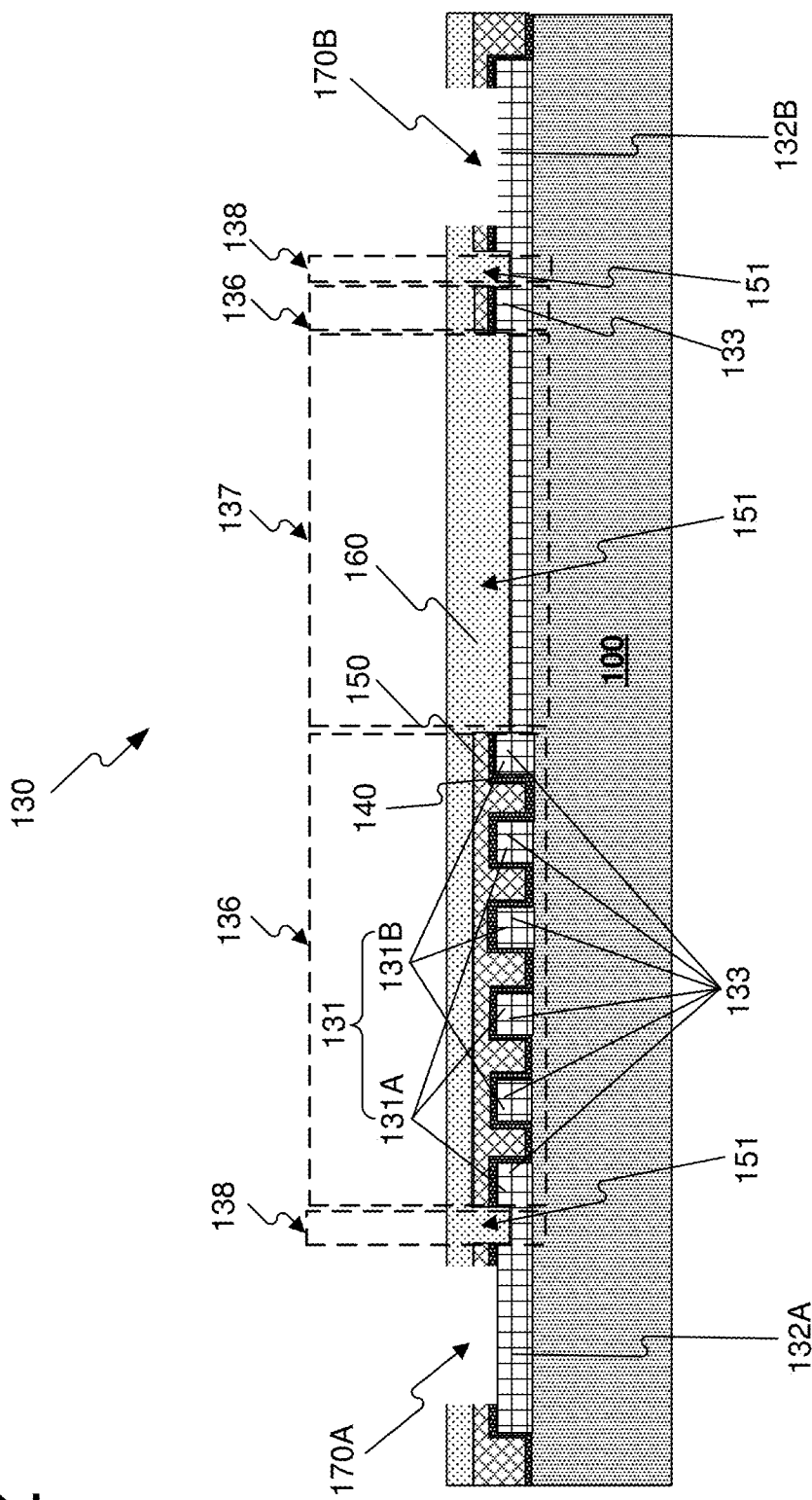

As illustrated in FIG. 6H, in step S7, second temperature compensation layer 160, first temperature compensation layer 150, and protective layer 140 are selectively etched to form first IDT via 170A and second IDT via 170B that expose a surface of first lead-out portion 132A and a surface of second lead-out portion 132B, respectively.

Figure 6I:
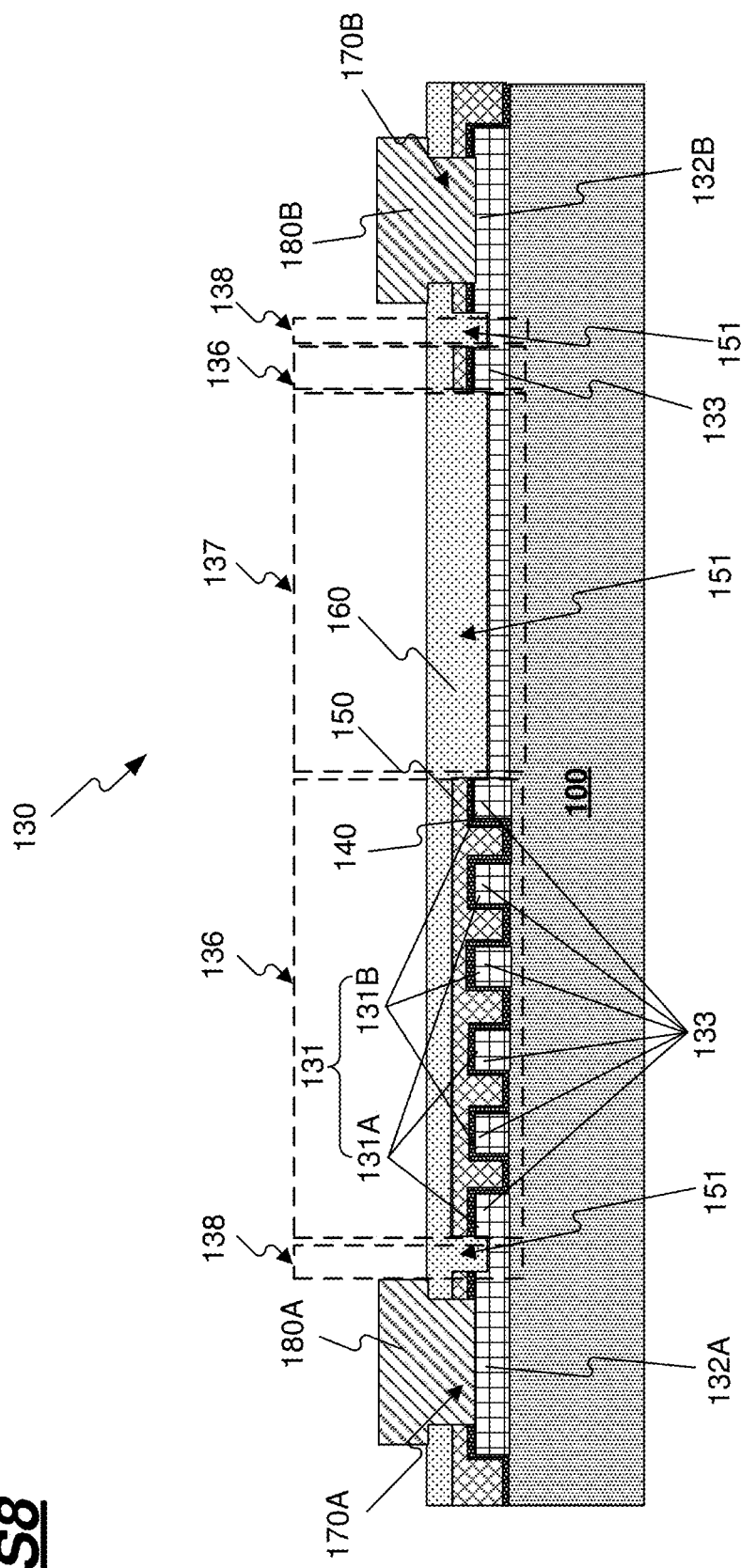

As illustrated in FIG. 6I, in step S8, first pad metal layer 180A and second pad metal layer 180B are formed in first IDT via 170A and second IDT via 170B, respectively, to electrically connect to first lead-out portion 132A and second lead-out portion 132B, respectively. First pad metal layer 180A and second pad metal layer 180B may be formed by a lift-off process, and may be formed of a metal material such as Ti, Cr, Al, Cu, Ni, Ag, Au, or another metal material, or a stacked combination of two or more of those materials.

Figure 6J:
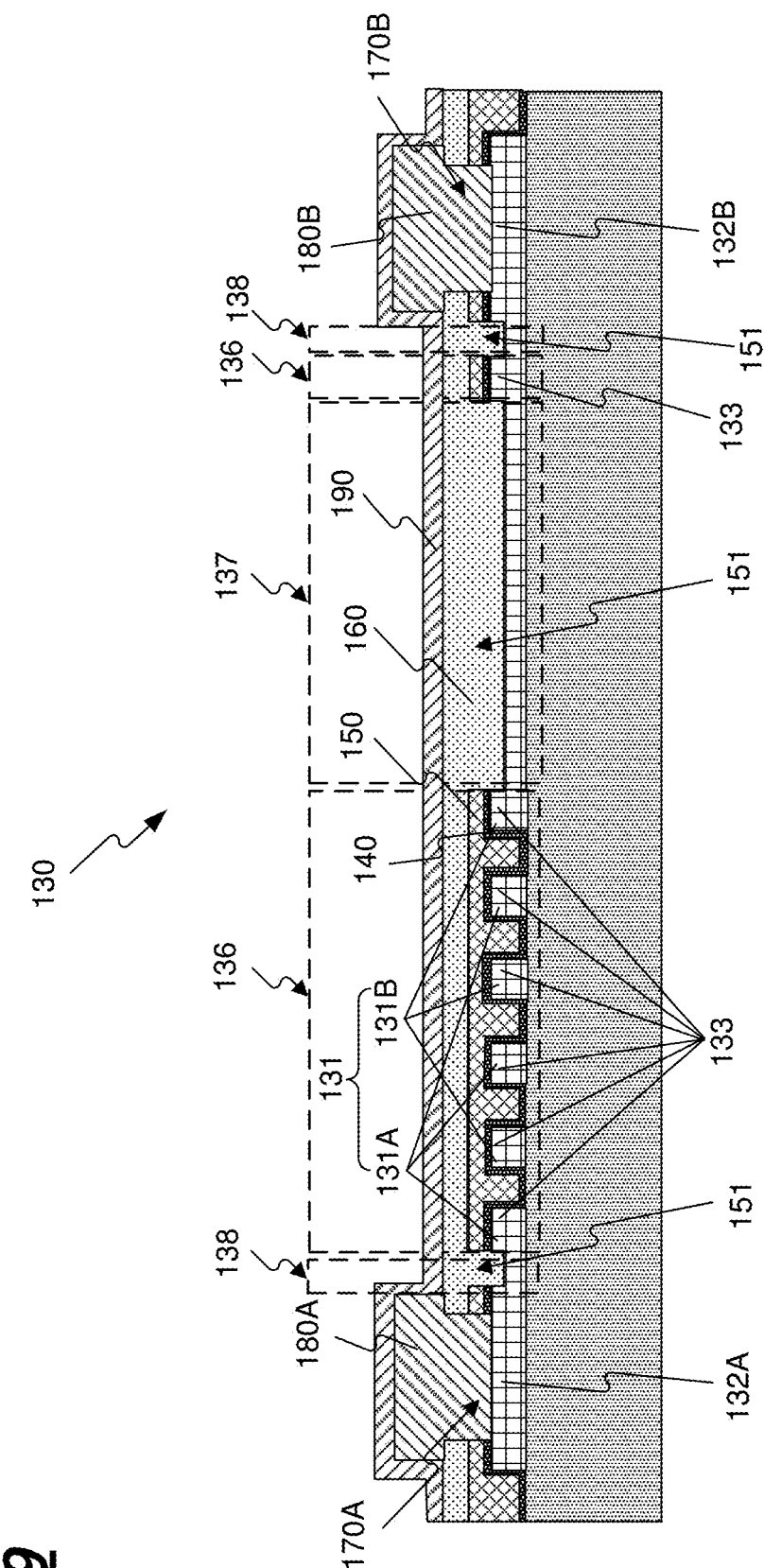

As illustrated in FIG. 6J, in step S9, passivation layer 190 is deposited on the structure of FIG. 6I to protect first and second pad metal layers 180A and 180B, and to function as a frequency adjustment layer for the filter. Passivation layer 190 may be formed of SiN, AlN, amorphous silicon, GaN, or another insulating material, or a stacked combination of two of more of those materials.

Figure 6K:
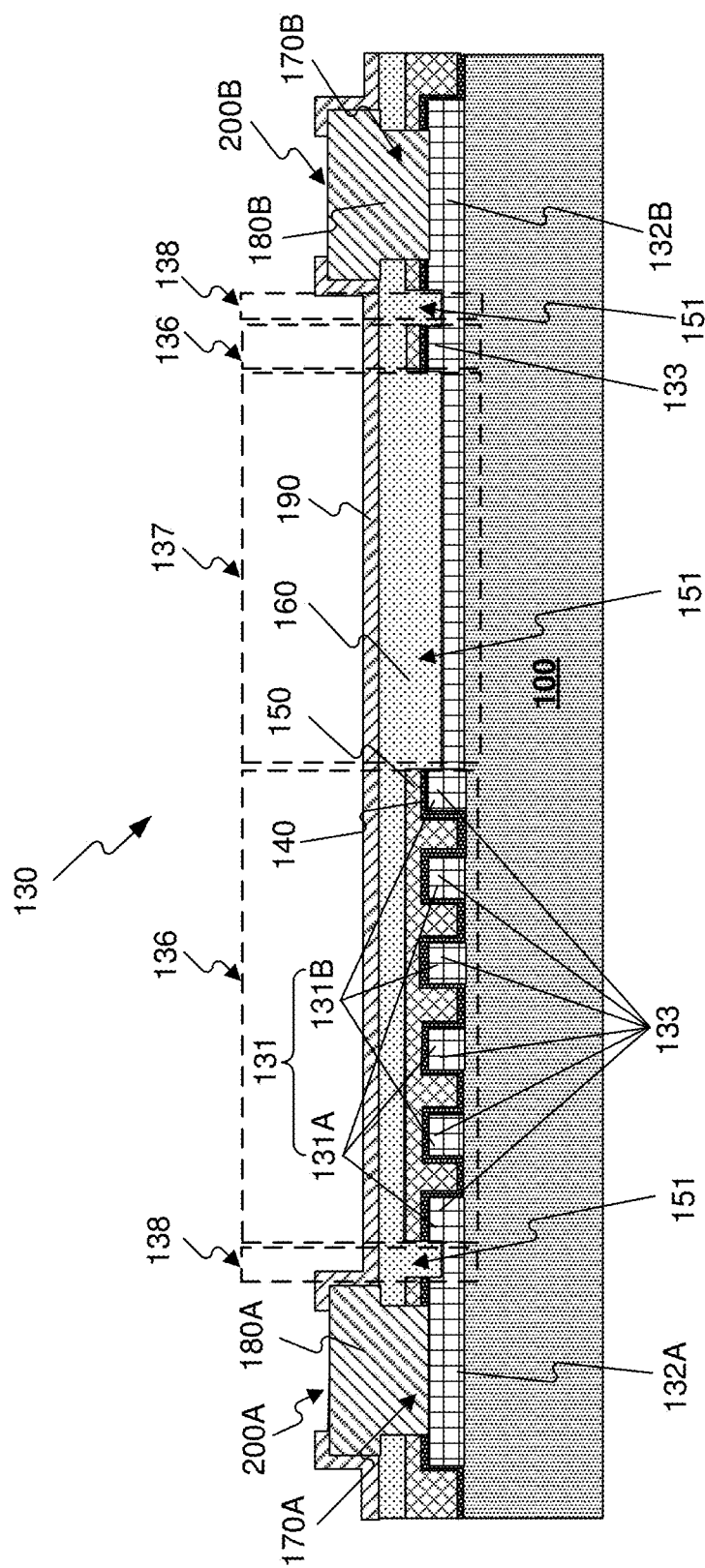

As illustrated in FIG. 6K, in step S10, passivation layer 190 is selectively etched to form first pad contact window 200A and second pad contact window 200B for external electrical connection. After step S10, the entire fabrication process is completed.

Other embodiments of the disclosure will be apparent to those skilled in the art from consideration of the specification and practice of the disclosure disclosed herein. It is intended that the specification and examples be considered as exemplary only, with a true scope and spirit of the invention being indicated by the following claims

The invention claimed is:

1. A surface acoustic wave (SAW) device, comprising:
a substrate;
an interdigital transducer (IDT) having lead-out portions and arrays of interdigital electrodes formed on the substrate, wherein the interdigital electrodes include central portions, end portions, and intermediate portions between the end portions and the lead-out portions, and a thickness of the interdigital electrodes at the end portions is greater than a thickness of the interdigital electrodes at the central portions and the intermediate portions, thereby forming protruding structures at the end portions of the interdigital electrodes;
a protective layer formed on the protruding structures at the end portions of the interdigital electrodes;
a first temperature compensation layer formed on the protective layer;
a second temperature compensation layer formed on the first temperature compensation layer and on the central portions and the intermediate portions of the interdigital electrodes; and
a passivation layer formed on the second temperature compensation layer,
wherein the protective layer, the first temperature compensation layer, and the second temperature compensation layer are formed between the passivation layer and the end portions of the interdigital electrodes, and
only the second temperature compensation layer is formed between the passivation layer and the central portions and the intermediate portions of the interdigital electrodes.

2. The SAW device of claim 1, wherein the arrays of interdigital electrodes include an array of first interdigital electrodes and an array of second interdigital electrodes, and the lead-out portions of the IDT comprise:
a first lead-out portion connected to the array of first interdigital electrodes; and a second lead-out portion connected to the array of second interdigital electrodes.

3. The SAW device of claim 2, wherein the protective layer, the first temperature compensation layer, and the second temperature compensation layer cover portions of the first lead-out portion and the second lead-out portion.

4. The SAW device of claim 3, further comprising:
a first IDT via and a second IDT via formed in the second temperature compensation layer, the first temperature compensation layer, and the protective layer, the first IDT via exposing a portion of the first lead-out portion, and the second IDT via exposing a portion of the second lead-out portion.

5. The SAW device of claim 4, further comprising:
a first pad metal layer formed in the first IDT via and electrically connected to the first lead-out portion; and
a second pad metal layer formed in the second IDT via and electrically connected to the second lead-out portion.

6. The SAW device of claim 5, wherein the passivation layer covers the first pad metal layer and the second pad metal layer.

7. The SAW device of claim 6, further comprising:
a first pad contact window and a second pad contact window formed in the passivation layer, the first pad contact window exposing a portion of the first pad metal layer, and the second pad contact window exposing a portion of the second pad metal layer.

8. The SAW device of claim 1, wherein the protective layer covers top surfaces and side surfaces of the protruding structures.

9. The SAW device of claim 8, wherein the first temperature compensation layer covers a portion of the protective layer that covers the top surfaces and the side surfaces of the protruding structures.

10. The SAW device of claim 1, wherein the interdigital electrodes and the protruding structures are integrally formed from a same material, and
the protruding structures are aligned with the interdigital electrodes.

11. The SAW device of claim 1, wherein the protective layer is formed of at least one of silicon nitride (SiN), aluminum nitride (AlN), gallium nitride (GaN), or amorphous silicon ($\alpha$-Si).

12. The SAW device of claim 1, wherein the first temperature compensation layer is formed of silicon oxide ($SiO_2$).

13. The SAW device of claim 1, wherein the second temperature compensation layer is formed of one of:
a single silicon oxide ($SiO_2$) layer; or
a stacked combination of a silicon oxide ($SiO_2$) layer and a layer formed of at least one of silicon nitride (SiN), aluminum nitride (AlN), gallium nitride (GaN), or amorphous silicon ($\alpha$-Si).

14. The SAW device of claim 1, wherein the passivation layer is formed of at least one of silicon nitride (SiN), aluminum nitride (AlN), gallium nitride (GaN), or amorphous silicon ($\alpha$-Si).

15. The SAW device of claim 1, wherein the substrate is formed of a piezoelectric material.

* * * * *

UNITED STATES PATENT AND TRADEMARK OFFICE
CERTIFICATE OF CORRECTION

| | |
|---|---|
| PATENT NO. | : 11,942,918 B2 |
| APPLICATION NO. | : 18/325204 |
| DATED | : March 26, 2024 |
| INVENTOR(S) | : Jian Wang |

It is certified that error appears in the above-identified patent and that said Letters Patent is hereby corrected as shown below:

On the Title Page

Item (57), in the Abstract, Line 4, "the interdigital electrodes includes" should read --the interdigital electrodes include--.

Signed and Sealed this
First Day of October, 2024

Katherine Kelly Vidal
*Director of the United States Patent and Trademark Office*